United States Patent
Han

(10) Patent No.: US 7,030,021 B2
(45) Date of Patent: Apr. 18, 2006

(54) METHOD OF FABRICATING METAL INTERCONNECTION OF SEMICONDUCTOR DEVICE

(75) Inventor: Jae Won Han, Gyeonggi-do (KR)

(73) Assignee: DongbuAnam Semiconductor Inc., Seoul (KR)

( * ) Notice: Subject to any disclaimer, the term of this patent is extended or adjusted under 35 U.S.C. 154(b) by 260 days.

(21) Appl. No.: 10/747,620

(22) Filed: Dec. 30, 2003

(65) Prior Publication Data
US 2005/0026445 A1 Feb. 3, 2005

(30) Foreign Application Priority Data
Jul. 31, 2003 (KR) ................ 10-2003-0052945

(51) Int. Cl.
*H01L 21/311* (2006.01)
(52) U.S. Cl. ............. 438/694; 438/702; 438/687; 205/291
(58) Field of Classification Search ............. 205/87, 205/103, 291; 438/652, 672–675, 687, 691–694, 438/700, 702, 703
See application file for complete search history.

(56) References Cited

U.S. PATENT DOCUMENTS

| | | | |
|---|---|---|---|
| 6,297,140 B1 | 10/2001 | Uzoh et al. | |
| 6,399,479 B1 * | 6/2002 | Chen et al. | 438/628 |
| 6,420,258 B1 | 7/2002 | Chen et al. | |
| 6,472,023 B1 * | 10/2002 | Wu et al. | 427/430.1 |
| 6,492,268 B1 | 12/2002 | Pyo | |
| 6,495,200 B1 | 12/2002 | Chan et al. | |
| 6,610,596 B1 * | 8/2003 | Lee et al. | 438/653 |
| 6,790,776 B1 * | 9/2004 | Ding et al. | 438/685 |
| 6,808,617 B1 * | 10/2004 | Sato et al. | 205/640 |
| 6,881,318 B1 * | 4/2005 | Hey et al. | 205/87 |
| 2003/0022493 A1 * | 1/2003 | Jiang et al. | 438/687 |
| 2003/0201538 A1 * | 10/2003 | Lee et al. | 257/751 |
| 2004/0092110 A1 * | 5/2004 | Sato et al. | 438/689 |

* cited by examiner

*Primary Examiner*—Kin-Chan Chen
(74) *Attorney, Agent, or Firm*—Pillsbury Winthrop Shaw Pittman LLP

(57) ABSTRACT

A method of fabricating a metal interconnection of semiconductor device is disclosed. A metal interconnection fabricating method according to the present invention comprises the steps of depositing a metal layer on a substrate having a predetermined structure; patterning a bottom metal layer through etching the metal layer; forming a pad electrically connecting the bottom metal layer to a scribe area; forming an insulating layer on the substrate including the bottom metal layer; forming a via hole and a trench, in which an upper metal layer is formed, on the insulating layer, the via hole connecting the bottom metal layer with the upper metal layer; forming a plating layer by means of electroplating; and performing a planarization process for the plating layer. Accordingly, the present invention needs not a separate seed layer because the bottom metal layer is used as a seed layer. In addition, the present invention can enhance device reliability by reducing electro-migration and stress-migration because the copper is uniformly grown from the bottom in one direction thereby completely filling the contact hole.

9 Claims, 3 Drawing Sheets

METHOD OF FABRICATING METAL INTERCONNECTION OF SEMICONDUCTOR DEVICE

BACKGROUND OF THE INVENTION

1. Field of the Invention

The present invention relates to a method of fabricating a metal interconnection of semiconductor device and, more particularly, to a method of forming a metal interconnection by using a bottom metal layer as a seed layer instead of using a physical seed as an electrode.

2. Background of the Related Art

FIGS. 1a through 1c illustrate, in cross-sectional views, the process steps for forming a metal interconnection of semiconductor device having a line damascene structure according to a prior art. The line damascene structure is made through forming a trench with an adequate depth on an insulating layer in the form of a line and forming a metal layer in the trench.

Referring to FIG. 1a, a line-shaped trench is formed on an insulating layer 10 deposited on a substrate (not shown) using photolithography. A diffusion barrier layer 12 is deposited over the surface of the insulating layer including the trench. Then, a seed layer 14 is formed through depositing copper on the diffusion barrier layer 12 using physical vapor deposition (hereinafter referred to as "PVD") such as sputtering.

Referring to FIG. 1b, a copper plating layer 16 is formed on the seed layer 14 by an electroplating method. Here, the plating layer 16 is formed thick such that the trench is filled completely.

Referring to FIG. 1c, the plating layer 16 is etched by chemical mechanical polishing (hereinafter referred to as "CMP") until the insulating layer is exposed. Thus, the diffusion barrier layer 12, the seed layer 14, and the plating layer 16 remain only in the trench 11 to complete a metal interconnection 16a.

As another prior art, there is a dual-damascene structure. FIGS. 2a through 2d illustrate a method for forming a metal interconnection having the dual-damascene structure according to a prior art.

Referring to FIG. 2a, a bottom conducting layer 28 is formed on a substrate (not shown) at regular intervals. Then an insulating layer is deposited over the bottom conducting layer, and a metal layer 26a is formed at regular intervals. The bottom conducting layer 28 is electrically connected with the metal layer 26a through a contact hole area 30. FIGS. 2b through 2d show, in cross-sectional views of FIG. 2a taken along a line VII–VII', the process steps for forming a metal interconnection with the dual-damascene structure.

Referring to FIG. 2b, a conducting material is deposited and patterned on a substrate (not shown) to form a bottom conducting layer 28. An insulating layer 20 is deposited over the bottom conducting layer 28, and a contact hole area 30 and a trench area coupled to the contact hole area 30 are formed by means of photolithography. Then, a diffusion barrier layer 22 and a seed layer 24 are formed in sequence over the substrate including the contact hole area and the trench area.

Referring to FIG. 2c, the substrate with the seed layer 24 is loaded in an electroplating apparatus and, then, a copper plating layer 26 is formed by electroplating. A surface planarization process is performed for the substrate with the plating layer using CMP. The surface planarization is performed for the plating layer 26, the seed layer 24, and the diffusion barrier layer 22 until the surface of the insulating layer 20 is exposed to form a metal interconnection 26a with a dual-damascene structure.

However, the above-mentioned methods of forming a metal interconnection cause several problems as follows. First, while removing the copper layer using the CMP, the insulating layer is eroded due to density difference in the metal layer pattern, thereby causing badness of product. Second, if the seed layer and the diffusion barrier layer have a different polishing speed respectively, the seed layer and the diffusion barrier layer has to be respectively polished using a different slurry, thereby complicating the CMP process and increasing production cost. Third, in the copper electroplating, the copper layer is grown on the equipotential surface of the seed layer by contacting an electrode to the seed layer. Here, if the seed layer is not formed in a narrow and deep hole, the copper may be not deposited uniformly on the seed layer to form void 32 and 32a. Thus, the semiconductor device may not work due to a short circuit. Forth, if there are particles on the diffusion barrier layer or the seed layer, the copper layer cannot be formed on the equipotential surface of the seed layer in electroplating and an area without copper can be formed, thereby causing a short circuit.

Finally, in electroplating, the copper film grows simultaneously on the bottom and the lateral walls of the hole, as shown in FIG. 3. Therefore, such a mixing in growth direction of copper causes electro-migration, stress-migration, and so on, thereby having a bad effect on device reliability.

SUMMARY OF THE INVENTION

Accordingly, the present invention is directed to a method of fabricating a metal interconnection of semiconductor device that substantially obviates one or more problems due to limitations and disadvantages of the related art.

An object of the present invention is to provide a method of fabricating a metal interconnection, which needs not a separate seed layer and can enhance device reliability by reducing electro-migration and stress-migration through filling completely a hole with copper which is grown uniformly in one direction.

To achieve these objects and other advantages and in accordance with the purpose of the invention, as embodied and broadly described herein, the present invention provides a method of fabricating a metal interconnection of semiconductor device comprising the steps of:

depositing a metal layer on a substrate having a predetermined structure;

patterning a bottom metal layer through etching the metal layer;

forming a pad electrically connecting the bottom metal layer to a scribe area;

forming an insulating layer on the substrate including the bottom metal layer;

forming a via hole and a trench, in which an upper metal layer is formed, on the insulating layer, the via hole connecting the bottom metal layer with the upper metal layer;

forming a plating layer by means of electroplating; and performing a planarization process for the plating layer.

In performing the electroplating, the present invention uses the bottom metal layer as a seed layer instead of using a separate seed layer to form the upper metal layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1A:
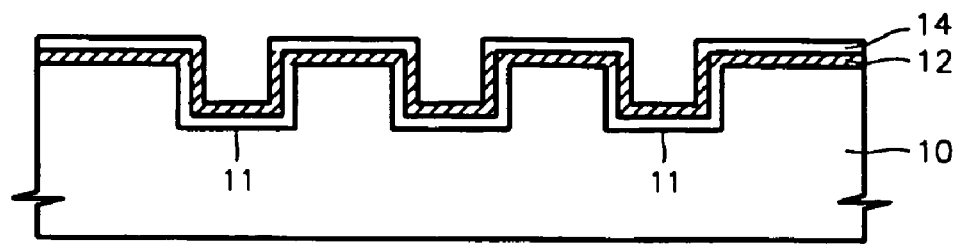
FIGS. 1a through 1c illustrate, in cross-sectional views, the process steps for fabricating a metal interconnection according to a prior art.
Figure 1B:
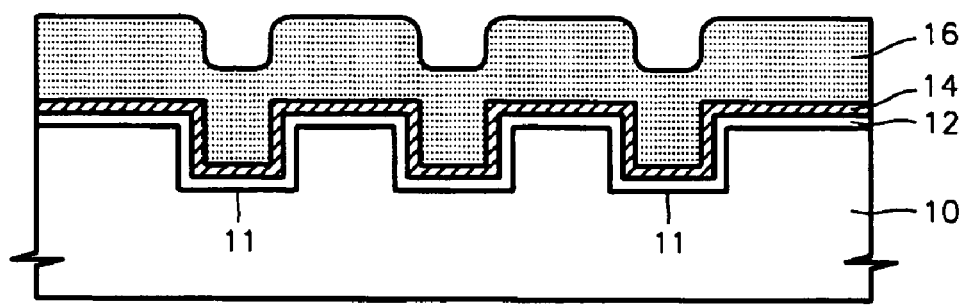
Figure 1C:
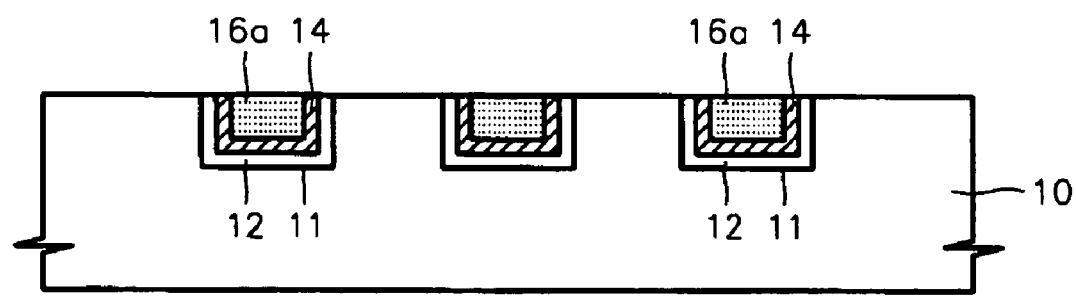
Figure 2A:
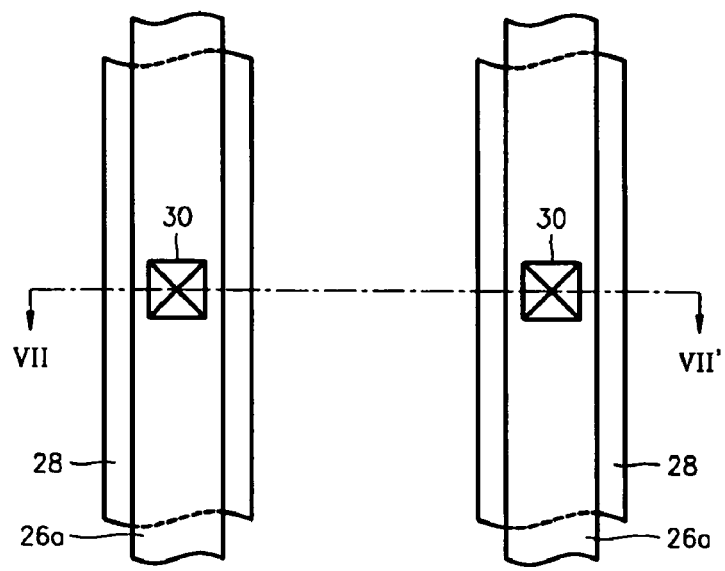
FIGS. 2a through 2d illustrate a method of fabricating a metal interconnection according to another prior art.
Figure 2B:
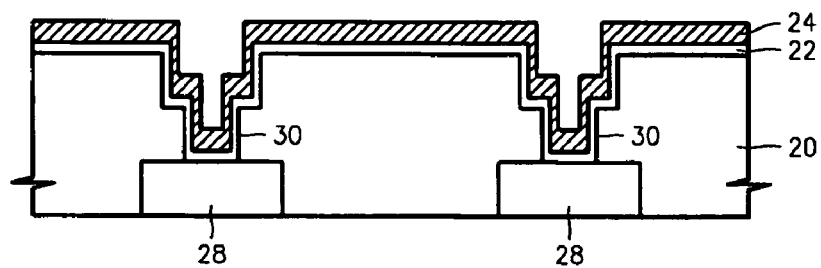
Figure 2C:
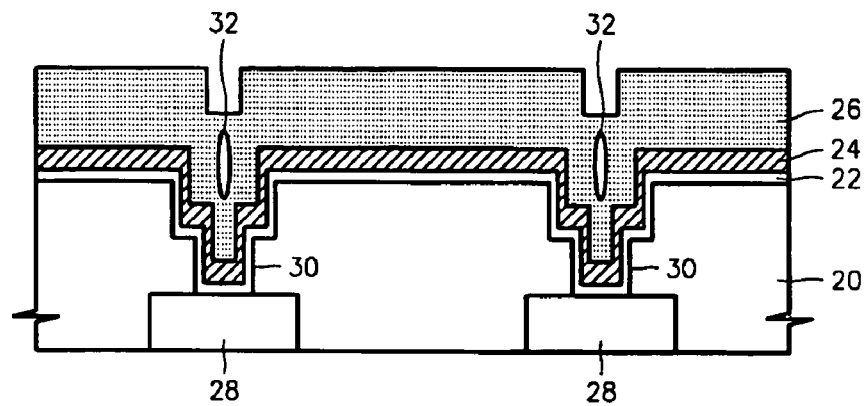
Figure 2D:
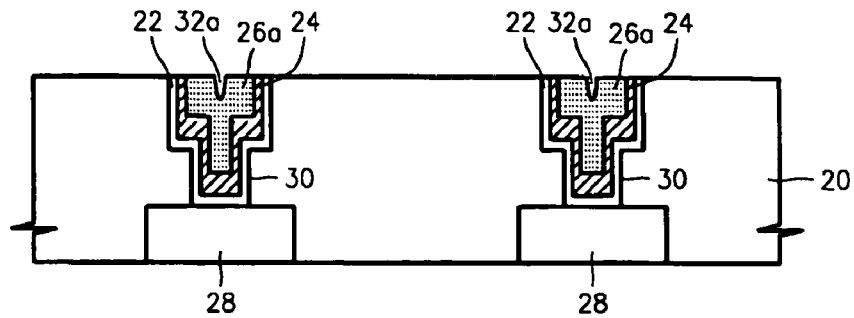
Figure 3:
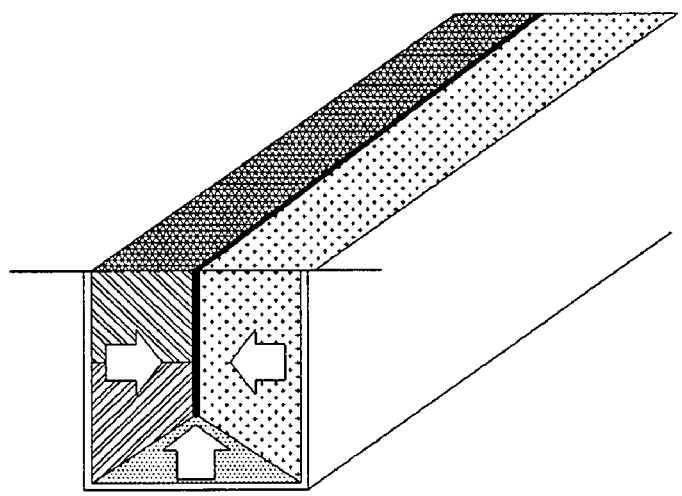
FIG. 3 is a cross-sectional view showing the direction of copper growth.
Figure 4:
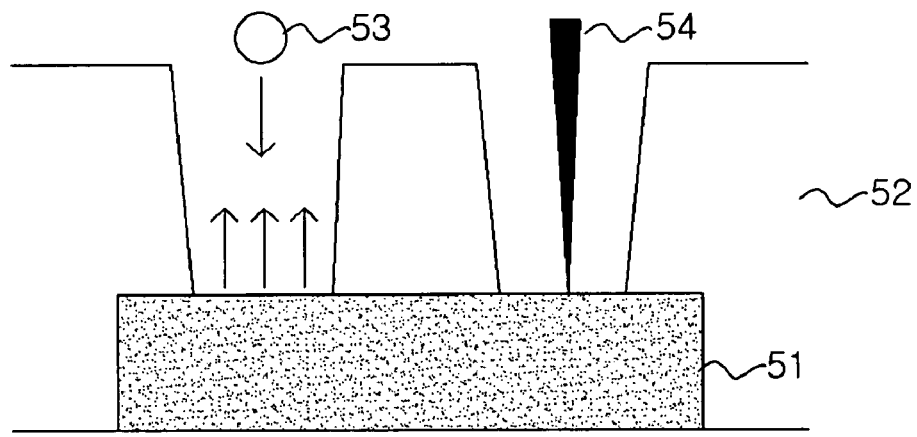
FIG. 4 illustrates an electroplating method according to the present invention.

Referring to FIG. 4, a metal layer is deposited on a substrate having a predetermined structure. Then, a bottom metal layer 51 is patterned through etching the metal layer and a pad 54, which electrically connects the bottom metal layer to a scribe area, is formed. An insulating layer 52 is deposited over the substrate including the bottom metal layer 51. The insulating layer is a TEOS (tetra ethyl ortho silicate) layer.

Next, a via hole and a trench in which an upper metal layer is formed are formed by etching the insulating layer. The via hole electrically connects the bottom metal layer and the upper metal layer.

Additionally, a barrier metal layer may be formed on the insulating layer with the via hole. The barrier metal layer is deposited with a uniform thickness by a sputtering process. The barrier metal layer prevents diffusion of metal at the same time as enhancing adhesive force for the following upper metal layer. The barrier metal layer is a single layer or multi-layer, which is made of at least a metal selected from the group of Ta, TaN, TaAlN, TaSiN, $TaSi_2$, Ti, TiN, TiSiN, WN, Co, and $CoSi_2$. The barrier metal layer has a thickness of 100~1000 Å.

Subsequently, the substrate is loaded in an electroplating apparatus, and a copper plating layer 53 is formed. Then, a planarization is performed for the substrate with the plating layer using CMP. The electroplating comprises the steps of loading the substrate into a chamber where electroplating process is performed; applying a voltage using the substrate as a cathode; and forming a copper layer by immersing the substrate in an electrolyte. According to the steps, the plating layer is formed on the bottom metal layer. In electroplating, the voltage is applied by the pad formed in the scribe area. The plating layer is made of a metal selected from all conductible metals. The present invention uses copper as an embodiment. The planarization process is performed for the plating layer until the surface of the insulating layer is exposed.

In case of using a conventional seed layer, the copper is deposited over the surface of the semiconductor substrate. However, in the present invention, the copper is deposited only on the exposed portion of bottom metal layer, thereby simplifying the CMP process. In addition, the metal layer remaining in the trench after performing the CMP process becomes an upper metal layer.

The method of fabricating a metal interconnection according to the present invention dose not use a separate seed layer. In addition, the copper is deposited without void and is grown from the bottom in one direction. Therefore, electro-migration and stress-migration, which are generated in case of using a separate seed layer and have a bad effect on device reliability, can be reduced.

Accordingly, the present invention needs not a separate seed layer because the bottom metal layer is used as a seed layer. In addition, the present invention can enhance device reliability by reducing electro-migration and stress-migration because the copper is uniformly grown from the bottom in one direction thereby completely filling the contact hole.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a metal interconnection of semiconductor device comprising the steps of:

depositing a metal layer on a substrate having a predetermined structure;

patterning a bottom metal layer by etching the metal layer;

forming a pad electrically connecting the bottom metal layer to a scribe area;

forming an insulating layer on the substrate including the bottom metal layer;

forming a via hole and a trench, in which an upper metal layer is formed, on the insulating layer, the via hole connecting the bottom metal layer with the upper metal layer;

forming a plating layer by means of electroplating; and performing a planarization process for the plating layer.

2. The method as defined by claim 1, further comprising a step of forming a barrier metal layer prior to the formation of the plating layer.

3. The method as defined by claim 2, wherein the barrier metal layer is a single layer that is made of a metal selected from the group consisting of Ta, TaN, TaAlN, TaSiN, $TaSi_2$, Ti, TiN, TiSiN, WN, Co, and $CoSi_2$, or a multi-layer that is made of at least two metals selected from said group.

4. The method as defined by claim 1, wherein the insulating layer is a TEOS layer deposited by PECVD.

5. The method as defined by claim 1, wherein the plating layer is a copper layer.

6. The method as defined by claim 1, wherein the electroplating comprises the steps of:

loading the substrate into a chamber where electroplating process is performed;

applying a voltage using the substrate as a cathode; and forming a plating layer by immersing the substrate in an electrolyte.

7. The method as defined by claim 6, wherein the voltage is applied through the pad formed in the scribe area.

8. The method as defined by claim 1, wherein the planarization process is a CMP process.

9. The method as defined by claim 8, wherein the CMP process is performed for the plating layer until the surface of the insulating layer is exposed.

* * * * *